United States Patent
Kao et al.

(10) Patent No.: US 9,887,234 B2
(45) Date of Patent: Feb. 6, 2018

(54) CMOS IMAGE SENSOR AND METHOD FOR FORMING THE SAME

(71) Applicant: Taiwan Semiconductor Manufacturing Company Limited, Hsinchu (TW)

(72) Inventors: Min-Feng Kao, Chiayi (TW);
Wei-Cheng Hsu, Kaohsiung (TW);
Tzu-Jui Wang, Kaohsiung (TW);
Hsiao-Hui Tseng, Tainan (TW);
Tzu-Hsuan Hsu, Kaohsiung (TW);
Jen-Cheng Liu, Hsin-Chu (TW);
Jhy-Jyi Sze, Hsin-Chu (TW);
Dun-Nian Yaung, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 7 days.

(21) Appl. No.: 14/162,821

(22) Filed: Jan. 24, 2014

(65) Prior Publication Data

US 2015/0214266 A1   Jul. 30, 2015

(51) Int. Cl.
*H01L 27/146* (2006.01)

(52) U.S. Cl.
CPC ...... *H01L 27/14689* (2013.01); *H01L 27/146* (2013.01); *H01L 27/1463* (2013.01); *H01L 27/14603* (2013.01); *H01L 27/14614* (2013.01); *H01L 27/14616* (2013.01)

(58) Field of Classification Search
CPC ............ H01L 27/146; H01L 27/14689; H01L 27/14603
See application file for complete search history.

(56) References Cited

U.S. PATENT DOCUMENTS

| | | | |
|---|---|---|---|
| 7,592,655 B2 | 9/2009 | Ohkawa et al. | |
| 8,368,130 B2 | 2/2013 | Ko et al. | |
| 8,531,565 B2 | 9/2013 | Wang et al. | |
| 8,564,085 B2 | 10/2013 | Kao et al. | |
| 8,569,807 B2 | 10/2013 | Chuang et al. | |
| 8,586,404 B2 | 11/2013 | Huang et al. | |
| 2007/0004076 A1* | 1/2007 | Lee et al. | 438/57 |
| 2008/0035940 A1 | 2/2008 | Nagaraja | |
| 2013/0049084 A1* | 2/2013 | Saka | 257/294 |

(Continued)

*Primary Examiner* — Lex Malsawma
*Assistant Examiner* — Xia Cross
(74) *Attorney, Agent, or Firm* — Jones Day

(57) ABSTRACT

A complementary metal oxide semiconductor (CMOS) image sensor and a method for fabricating the same are provided. An example CMOS image sensor includes first active regions of a semiconductor substrate, where the first active regions are arranged in rows or columns. Photosensitive regions are formed in the first active regions. The CMOS image sensor also includes second active regions of the semiconductor substrate that are interposed between the first active regions. Each of the second active regions includes a device isolation region formed by doping the semiconductor substrate with impurities. Each of the second active regions also includes a channel region of a field effect transistor (FET) that is formed within the device isolation region and is configured to connect source and drain regions of the FET. At least one control gate is formed over each of the second active regions.

20 Claims, 7 Drawing Sheets

(56) References Cited

U.S. PATENT DOCUMENTS

2013/0049126 A1\* 2/2013 Flachowsky et al. ........ 257/369
2013/0228671 A1 9/2013 Chou et al.
2013/0299886 A1 11/2013 Chuang et al.
2013/0307104 A1 11/2013 Tsai et al.
2014/0302630 A1\* 10/2014 Tian .................. H01L 27/14609
　　　　　　　　　　　　　　　　　　　　　　　438/60

\* cited by examiner

CMOS IMAGE SENSOR AND METHOD FOR FORMING THE SAME

TECHNICAL FIELD

The technology described in this disclosure relates generally to an image sensor and a method of fabricating the same and more particularly to a complementary metal oxide semiconductor (CMOS) image sensor including photosensitive regions and a method of fabricating the same.

BACKGROUND

Image sensors may be semiconductor devices that convert optical images into electrical signals. Complementary metal oxide semiconductor (CMOS) image sensors may use CMOS fabrication technology to create photosensitive devices that capture and process optical images within a single integrated chip. A photodiode may typically be used as a photodetector in the CMOS image sensors. CMOS image sensors may have advantages over traditional charge-coupled devices (CCDs). In particular, a CMOS image sensor may have a high image acquisition rate, lower operating voltage, lower power consumption, and higher noise immunity. In addition, CMOS image sensors may be fabricated on the same high-volume wafer processing lines as general logic and memory devices. As a result, a CMOS image chip may comprise both image sensors and all necessary logic devices, such as amplifiers, analog-to-digital converters, and the like.

DETAILED DESCRIPTION

Figure 1A:
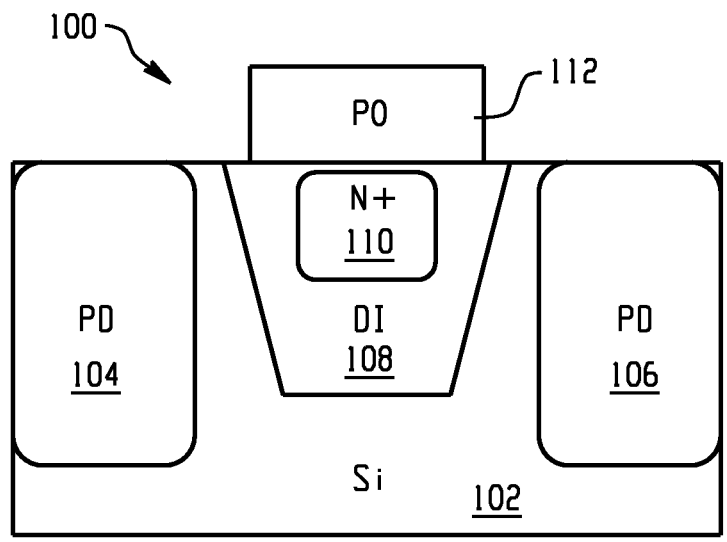
FIG. 1A depicts a cross-sectional view of an example CMOS image sensor device in accordance with an embodiment.

FIG. 1A depicts a cross-sectional view of an example CMOS image sensor device 100 in accordance with an embodiment. The CMOS image sensor device 100 may be formed in an epitaxial layer over a silicon substrate 102. Photosensitive regions 104, 106 may be formed in the silicon substrate 102. The photosensitive regions 104, 106 may each comprise, for example, an n-type photo active region and a p-type photo active region that together form a PN junction. The PN junction may function as a photodiode.

The CMOS image sensor device 100 may be a portion of a larger CMOS image sensor. The larger CMOS image sensor may be a pixelated metal oxide semiconductor and may include an array of light sensitive picture elements (e.g., pixels), each of which may include a logic circuit with transistors (e.g., field effect transistors that may include a switching transistor and a reset transistor), capacitors, and photosensitive elements (e.g., photodiodes), among other elements. The CMOS image sensor may utilize light-sensitive CMOS circuitry to convert photons into electrons. The light-sensitive CMOS circuitry may comprise the aforementioned photosensitive elements (e.g., the photosensitive regions 104, 106 as illustrated in FIG. 1A). As a photosensitive element is exposed to light, an electrical charge may be generated in the photosensitive element. Each pixel may generate electrons proportional to the amount of light that falls on the pixel, and the electrons may be converted into a voltage signal in the pixel and further transformed into a digital signal by an analog-to-digital converter.

The CMOS image sensor device 100 may further include a device isolation region 108 that is interposed between the photosensitive regions 104, 106. The device isolation region 108 may be configured to prevent crosstalk and interference between the photosensitive regions 104, 106. In an example, the photosensitive regions 104, 106 may each be parts of separate light sensitive picture elements (e.g., pixels), such that the device isolation region 108 may be configured to prevent crosstalk and interference between the adjacent pixels by physically separating the pixels and providing electrical isolation between the pixels. In accordance with an embodiment, the isolation region 108 may be formed by implanting the semiconductor substrate 102 with impurities (e.g., p-type dopants). The isolation region 108 may thus be in contrast to a shallow trench isolation (STI) region that may be formed by etching a portion of a substrate to form a trench and then filling the trench with an oxide or another dielectric material.

As described above, a pixel in a CMOS image sensor may include a logic circuit that includes field effect transistors (FETs) and other elements. In FIG. 1A, a FET included in such a logic circuit may include a gate electrode 112. In particular, the FET including the gate electrode 112 may generate a signal related to an intensity or brightness of a light that impinges on one or more of the photosensitive regions 104, 106. In accordance with an embodiment, the FET may be a transfer transistor. However, the FET may be an example of the many types of functional transistors that may be utilized within the CMOS image sensor device 100. For example, various embodiments of the CMOS image sensor device 100 may include other FETs, such as a reset transistor, a source follower transistor, or a select transistor. These FETs may be arranged, for example, to form a four transistor image sensor. Such transfer, reset, source follower, and select transistors are described in greater detail below with reference to FIG. 2A.

In FIG. 1A, the gate electrode 112 may be formed over a gate dielectric (not shown), and the gate electrode 112 and the gate dielectric may be formed and patterned by any suitable process known in the art. The gate dielectric layer may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate electrode 112 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped polycrystalline silicon, other conductive materials, or a combination thereof. In accordance with an embodiment, the gate electrode 112 may be formed of polysilicon by depositing doped or undoped polysilicon (e.g., via a low-pressure chemical vapor deposition (LPCVD)).

The gate electrode 112 may be configured to control a conductivity of a channel region 110 of the FET. As illustrated in FIG. 1A, the channel region 110 may be formed within the device isolation region 108. Further, as shown in FIG. 1A, the device isolation region 108 may include a portion that is beneath the channel region 110. In one example, the channel region 110 of the FET may be an N+ channel that is formed by doping a portion of the device isolation region 108 with additional N+ impurities. In one example, the channel region 110 may be formed by implanting appropriate n-type dopants such as phosphorous, arsenic, antimony, or the like into the device isolation region 108. Drain and source regions of the FET (not shown in FIG. 1A) may be formed in the epitaxial layer over the silicon substrate 102, and the channel region 110 may be configured to act as a conductive channel that connects the drain and source regions.

In the example of FIG. 1A, where the channel region 110 may be an N+ channel region, the device isolation region 108 may be an area of the substrate 102 that is doped with p-type impurities. In other examples, the channel region 110 may be a P+ channel region. In such other examples, the device isolation region 108 may be an area of the substrate 102 that is doped with n-type impurities. As noted above, the photosensitive regions 104, 106 may comprise PN junctions and may thus include both p-type and n-type regions.

Figure 1B:
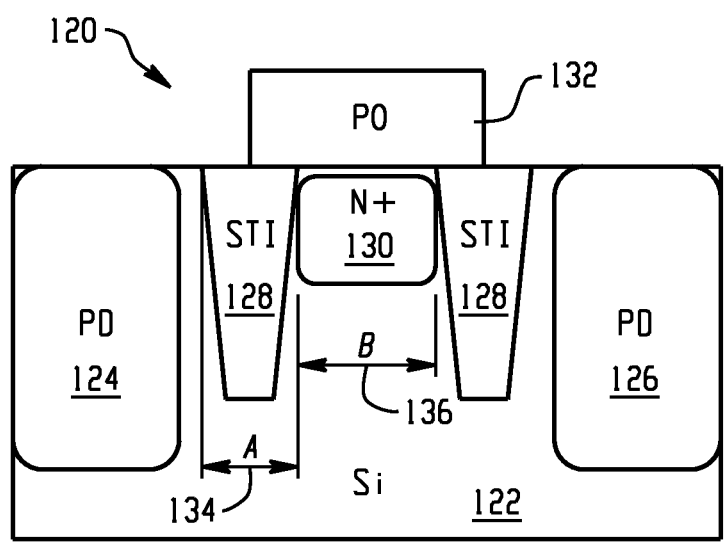
FIG. 1B depicts a cross-sectional view of an alternative CMOS image sensor device, where the alternative CMOS image sensor device may utilize shallow trench isolation (STI) regions.

FIG. 1B depicts a cross-sectional view of an alternative CMOS image sensor device 120, where the alternative CMOS image sensor device 120 may utilize shallow trench isolation (STI) regions 128. Similar to the CMOS image sensor device 100 of FIG. 1A, the CMOS image sensor device 120 of FIG. 1B may be formed in an epitaxial layer over a silicon substrate 122. Photosensitive regions 124, 126 (e.g., photodiodes including PN junctions) may be formed in the silicon substrate 122. The CMOS image sensor device 120 may further include device isolation regions 128, where each of the device isolation regions 128 may be characterized as having a width A 134. The device isolation regions 128 may be interposed between the photosensitive regions 124, 126. In the example of FIG. 1B, the device isolation regions 128 may be shallow trench isolation (STI) regions that may be formed by etching a portion of the substrate 122 to form a trench and then filling the trench with an oxide or another dielectric material. The STI device isolation regions 128 may thus be in contrast to the device isolation region 108 of FIG. 1A, where the device isolation region 108 may be formed via the doping implantation process described above.

The CMOS image sensor device 120 of FIG. 1B may further include a gate electrode 132 that may generate a signal related to an intensity or brightness of light that impinges on one or more of the photosensitive regions 124, 126. The gate electrode 132 may also be configured to control a conductivity of a FET channel region 130. As illustrated in FIG. 1B, the channel region 130 may be formed between the STI device isolation regions 128. Further, as shown in FIG. 1B, the device isolation regions 128 may not include a portion that is directly below the channel region 130. The channel region 130 may be an N+ channel that is formed by any suitable process known in the art, and the channel region 130 may be characterized as having a width B 136.

Figure 1C:
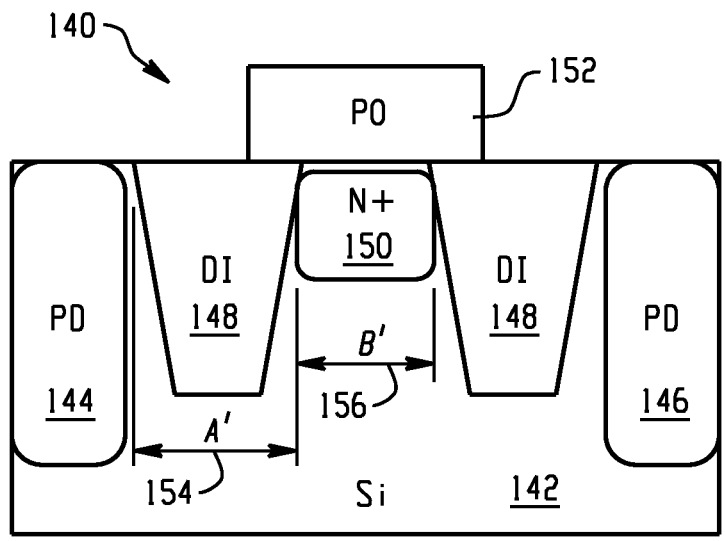
FIG. 1C depicts a cross-sectional view of a second alternative CMOS image sensor device, where the second alternative CMOS image sensor device may utilize a plurality of implanted device isolation regions.

FIG. 1C depicts a cross-sectional view of a second alternative CMOS image sensor device 140, where the second alternative CMOS image sensor device 140 may utilize a plurality of implanted device isolation regions 148. Similar to the CMOS image sensor devices 100, 120 of FIGS. 1A and 1B, the CMOS image sensor device 140 of FIG. 1C may be formed in an epitaxial layer over a silicon substrate 142. Photosensitive regions 144, 146 may be formed in the silicon substrate 142. The CMOS image sensor device 140 may further include device isolation regions 148, where each of the device isolation regions 148 may be characterized as having a width A' 154. In the example of FIG. 1C, the device isolation regions 148 may be may be formed by implanting the semiconductor substrate 142 with impurities (e.g., p-type impurities), such that the device isolation regions 148 are non-STI isolation regions.

The CMOS image sensor device 140 of FIG. 1C may further include a gate electrode 152. The gate electrode 152 may be configured to control a conductivity of a channel region 150. As illustrated in FIG. 1C, the channel region 150 may have a width B' 156 and may be an N+channel that is formed between the non-STI device isolation regions 148. As shown in FIG. 1C, the device isolation regions 148 may not include a portion that is directly below the channel region 150.

The CMOS image sensor devices 100, 140 of FIGS. 1A and 1C may offer advantages over the CMOS image sensor device 120 of FIG. 1B. FIGS. 1A and 1C may be characterized as depicting "non-STI devices" 100, 140, because the device isolation regions 108, 148 used in these devices 100, 140, may not be formed via a shallow trench isolation process. Such non-STI devices 100, 140 may offer improved pixel performance and improved device performance as compared to the CMOS image sensor device 120 of FIG. 1B, which may be characterized as an "STI device" due to its utilization of the STI device isolation regions 128. As pixel pitch decreases, direct current (DC) and noise performance may become increasingly important in a CMOS image sensor. The non-STI devices 100, 140 of FIGS. 1A and 1C may allow for less silicon surface damage and less plasma damage, as compared to the STI device 120 of FIG. 1B. The decreased silicon surface damage and the decreased plasma damage may improve the DC and noise performance and other characteristics of the image sensor.

However, merely replacing the STI device isolation regions 128 of the device 120 of FIG. 1B with the non-STI device isolation regions 148 (i.e., as depicted in FIG. 1C) may cause undesirable results. Full well capacity (FWC) may be a performance index indicating a dynamic range of an image sensor. An amount of charge that an individual pixel can store before saturating may be measured by the FWC metric. Greater FWC may allow for a higher dynamic range and a better signal-to-noise (SNR) ratio. Smaller FWC may cause saturation and image smearing due to a blooming phenomenon. FWC may be related to the dimensions of a photosensitive region of the image sensor. In comparing the widths A and A' 134, 154 for the device isolation regions 128 and 148, respectively, the width A' 154 of the non-STI isolation region 148 may be greater than the width A 134 of the STI isolation region 128. Thus, for a given pixel pitch, the non-STI isolation region 148 may consume a greater amount of area, as compared to the STI isolation region 128, such that a dimension of the photosensitive regions 144, 146 may be smaller than the photosensitive regions 124, 126. As a result, the non-STI device 140 may have a smaller FWC as compared to the STI device 120.

The non-STI device 140 of FIG. 1C may also exhibit a worse narrow width effect (NWE) as compared to the STI device 120 of FIG. 1B. The NWE may refer to a phenomenon in which a threshold voltage for a transistor increases as a gate width or a channel region narrows. For example, with reference to FIGS. 1B and 1C, when the control gates 132, 152 are turned on, the channel regions 130, 150 may become conductive. In FIG. 1B, the width B 136 of the channel region 130 may be initially determined by the physical gap between the isolation regions 128 on the sides of the channel region 130. Similarly, in FIG. 1C, the width B' 156 of the channel region 150 may be initially determined by the physical gap between the isolation regions 148 on the sides of the channel region 150.

Figure 1D:
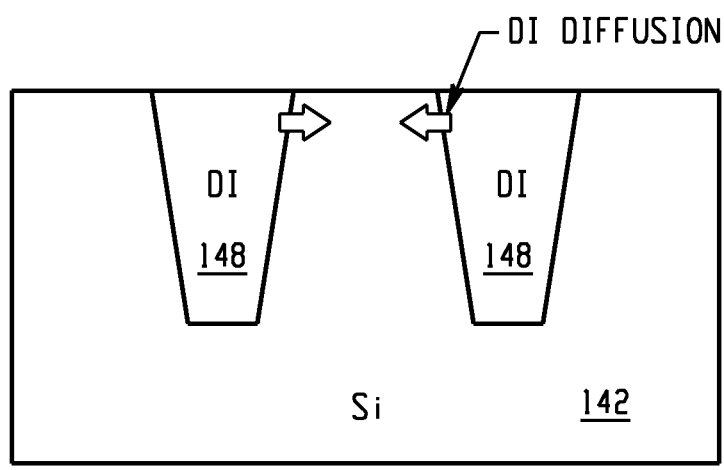
FIG. 1D depicts an example lateral diffusion that may occur in the second alternative CMOS image sensor device.

In comparing the widths B and B' 136, 156 for the channel regions 130, 150, respectively, the width B' 156 of the non-STI device 140 may be less than the width B 136 of the STI device 120. Thus, for a given pixel pitch, the non-STI device 140 may exhibit a worse NWE, as compared to the STI device 120, due to the fact that the width B' 156 may be less than the width B 136. The NWE effect exhibited in the non-STI device 140 may be made worse due to diffusion of the implanted device isolation regions 148, as illustrated in FIG. 1D. In FIG. 1D, the implanted device isolation regions 148 may be shown as diffusing towards each other, which may thus increase the effective area of the isolation regions 148 and cause the width B' 156 of the channel region 150 to become smaller. The decreased width B' 156 of the channel region 150 may cause the non-STI device 140 of FIG. 1C to exhibit a worse NWE.

The design of the CMOS image sensor device 100 of FIG. 1A may allow for the above-described advantages that may be inherent in non-STI image sensors (e.g., improved pixel performance, improved device performance, decreased silicon surface damage, decreased plasma damage, etc.) and may also overcome the FWC and NWE issues described above for the device 140 of FIG. 1C. As described above, in the CMOS image sensor device 100 of FIG. 1A, the channel region 110 may be formed within the device isolation region 108, such that the device isolation region 108 may include a portion that is directly below the channel region 110. Utilizing the design of the device 100, any lateral diffusion in the device isolation region 108 may not affect a width of the channel region 110, such that the lateral diffusion may not increase a narrow width effect (NWE) in the device 100. This is in contrast to the device 140 of FIG. 1C, where the lateral diffusion of the device isolation regions 148 may cause a narrowing of the width B' 156 and thus increase the NWE in the device 140.

Additionally, as illustrated in FIG. 1A, the device isolation region 108 may be disposed in a single, continuous volume that may be disposed substantially directly below the gate electrode 112. In being disposed substantially directly below the gate electrode 112, a majority of the device isolation region 108 may be located directly below the gate electrode 112, such that the device isolation region 108 may not extend a substantial distance laterally away from the gate electrode 112. The device isolation region 108 may thus have a size and geometry that allows the photosensitive regions 104, 106 to encompass volumes that extend to areas that are nearly directly below the gate electrode 112. Thus, for a given pixel pitch, the device isolation region 108 may consume a relatively small amount of area, which may allow the photosensitive regions 104, 106 to be relatively large in size. As a result, the device 100 of FIG. 1A may have a larger FWC as compared to the device 140 of FIG. 1C. These aspects of the design of the CMOS image sensor device 100 may be illustrated in the example of in FIG. 1A.

Figure 2A:
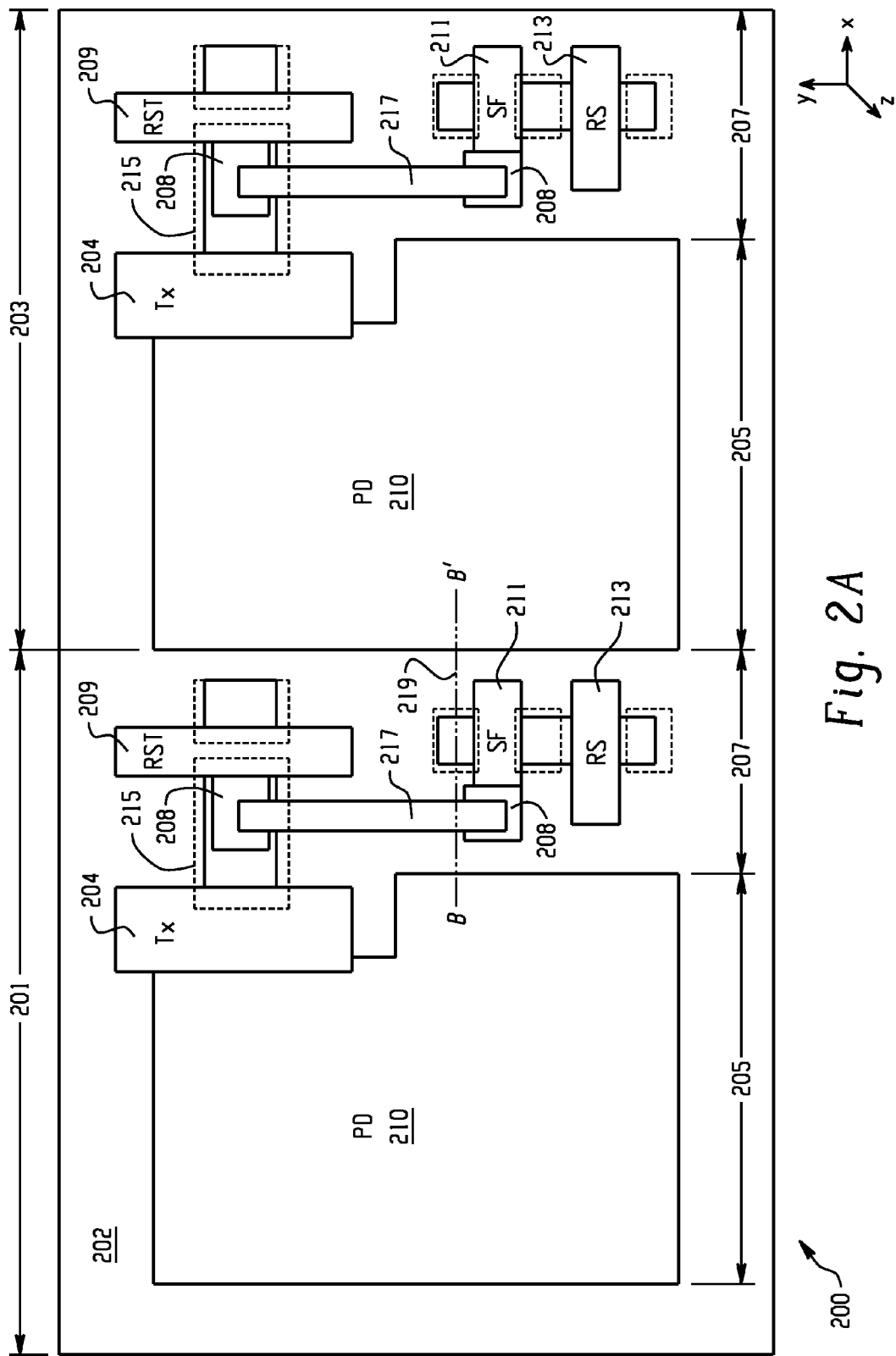
FIG. 2A depicts a plan view of an example CMOS image sensor, where the example CMOS image sensor may include a first pixel and a second pixel.

FIG. 2A may depict a plan view of an example CMOS image sensor 200, where the example CMOS image sensor 200 may include a first pixel 201 and a second pixel 203. As depicted in FIG. 2A, the example CMOS image sensor 200 may include photodiodes 210 that may be arranged in a row. Although only the two photodiodes 210 may be depicted in the example of FIG. 2A, it should be understood that more than two photodiodes may be included in the example CMOS image sensor 200. Further, although the example of FIG. 2A may depict the photodiodes 210 as being arranged in the row, in other examples, the photodiodes 210 may be arranged in a column.

The first pixel 201 and the second pixel 203 may each utilize a similar structure, where the structure may include a photodiode 210 and a plurality of transistors 204, 209, 211, 213 that together form a pixel. Each of the transistors 204, 209, 211, 213 may include a control gate for controlling aspects of the associated transistor (e.g., a conductivity of a channel region of the associated transistor). The photodiodes 210 may be formed in first active regions 205 of a semiconductor substrate, and the plurality of transistors 204, 209, 211, 213 may be formed in second active regions 207 of the semiconductor substrate. The second active regions 207 may be connected to sides of the first active regions 205, such that the second active regions 207 may be interposed between the photodiodes 210 of the row. It should be understood that because the photodiodes 210 may also be arranged in columns, the second active regions 207 may similarly be interposed between the photodiodes 210 arranged in the columns. In FIG. 2A, an area 202 may comprise a device isolation region that may separate the photodiodes 210 from each other and may separate each of the photodiodes 210 from other components within their respective pixels 201, 203. The separation provided by the device isolation region 202 may provide electrical insulation among these components.

The second active regions 207 may include portions of the device isolation region 202 that may be formed by doping the semiconductor substrate with impurities. The portions of the device isolation region 202 may be formed between the photodiodes 210 and may be configured to prevent signal interference or signal overflow between the photodiodes 210. Each of the second active regions 207 may also include a channel region of a field effect transistor (FET) that is formed within a portion of the device isolation region 202 (e.g., as depicted in FIG. 1A, where the channel region 110 is formed within the device isolation region 108). Source and drain regions of the FET may also be formed in the semiconductor substrate, and the channel regions formed within the portions of the device isolation region 202 may be configured to connect the source and drain regions.

As described above, the plurality of transistors 204, 209, 211, 213 may be formed in the second active regions 207. Each of the transistors 204, 209, 211, 213 may include a control gate for controlling aspects of one or more of the photodiodes 210. In an example embodiment, the plurality of transistors may comprise a transfer transistor 204, a reset transistor 209, a source follower transistor 211, and a row select transistor 213. The transfer transistor 204 may control the transmission of electric charges generated by the photodiode 210 (e.g., electrons or holes) to a floating diffusion region 215. The reset transistor 209 may reset the potential of the floating diffusion region 215 to a driving voltage. The source follower transistor 211 may be configured to receive the potential of the floating diffusion region 215 via a metal layer 217. Contact layers 208 may also be used in transferring the potential of the floating diffusion region 215 to the source follower transistor 211, as illustrated in FIG. 2A. The reset transistor 213 may be used to select one of the pixels 201, 203.

Figure 2B:
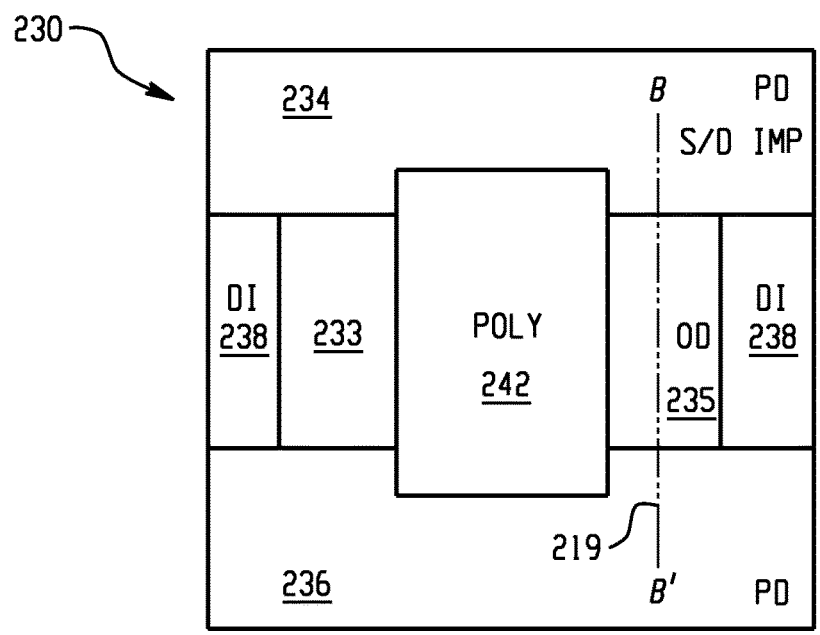
FIG. 2B depicts a top view of a portion of the example CMOS image sensor.

FIG. 2B may depict a top view 230 of a portion of the example CMOS image sensor 200. As illustrated in FIG. 2B, the top view 230 may include the portion of the example CMOS image sensor 200 that is near a B-B' cutline 219 of FIG. 2A. In the top view 230 of FIG. 2B, photodiode regions 234, 236 may be separated by a device isolation region 238 that may be formed by implanting the semiconductor substrate with impurities. The device isolation region 238 may be configured to help ensure that the photodiode region 234 is electrically insulated from the photodiode region 236, and vice versa.

A channel region of a FET may be formed within the device isolation region 238 and may be configured to connect source and drain regions 233, 235 of the FET. Depending on a bias condition, the region 233 may comprise the source region or the drain region, and similarly, depending on the bias condition, the region 235 may comprise the source region or the drain region. Like the channel region, the source and drain regions 233, 235 may be formed by implanting the device isolation region 238 with additional impurities. In one example, the device isolation region 238 may be doped with p-type impurities, the channel region may be an N+ channel region, and the source and drain regions 233, 235 may be N++ regions. In another example, the device isolation region 238 may be doped with n-type impurities, the channel region may be a P+ channel region, and the source and drain regions 233, 235 may be P++ regions. The example CMOS image sensor 200 may further include a polysilicon gate 242, as illustrated in the top view 230 of FIG. 2B. The polysilicon gate 242 may be used, for example, to control a conductivity of the channel region, which may be used to control the transmission of electric charges between the source and drain regions 233, 235.

Figure 2C:
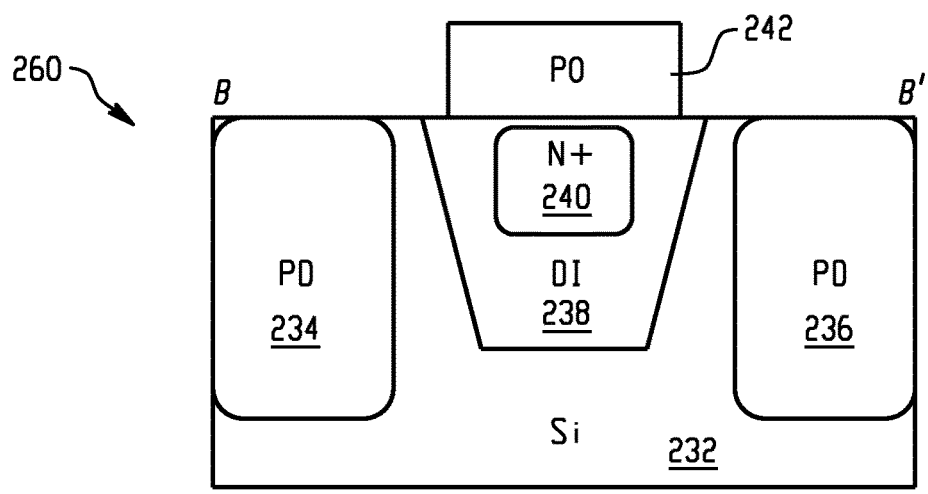
FIG. 2C depicts a cross-sectional view of a portion of the example CMOS image sensor.

FIG. 2C may depict a cross-sectional view 260 of a portion of the example CMOS image sensor 200. As illustrated in FIG. 2C, the cross-sectional view 260 may be taken along the B-B' cutline 219 of FIG. 2A. The photodiode regions 234, 236 formed in a semiconductor substrate 232 may be separated by the device isolation region 238, where the device isolation region 238 may be configured to prevent crosstalk and interference between the photodiode regions 234, 236. In accordance with an embodiment, the isolation region 238 may be formed by implanting the semiconductor substrate 232 with impurities (e.g., p-type impurities). The polysilicon gate electrode 242 may be configured to control a conductivity of an N+ channel region 240 of the FET. As illustrated in FIG. 2C, the N+ channel region 240 may be formed within the device isolation region 238.

In the example of FIG. 2C, at least three sides of the N+ channel region 240 may be surrounded by the device isolation region 238. The device isolation region 238 may comprise a single, continuous volume of material within the semiconductor substrate 232 that is disposed substantially beneath the polysilicon gate electrode 242. Thus, the device isolation region 238 may not include multiple, discrete volumes of material that surround the N+ channel region 240, which may be in contrast to the examples of FIGS. 1B and 1C, as described above.

Figure 3A:
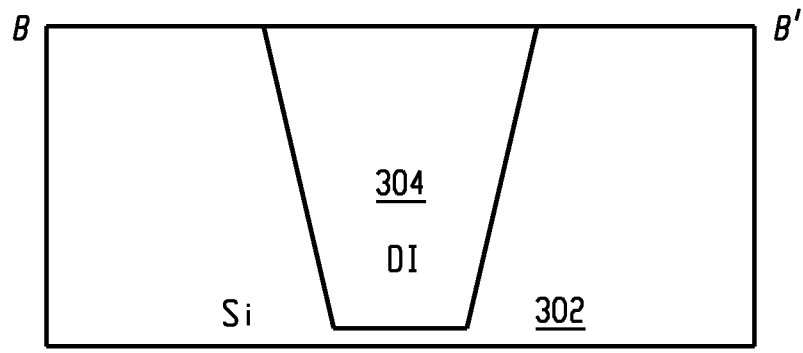
FIGS. 3A-3E depict example intermediate steps that may be used in the formation of a CMOS image sensor in accordance with an embodiment.

FIGS. 3A-3E depict example intermediate steps that may be used in the formation of a CMOS image sensor in accordance with an embodiment. FIG. 3A may depict a formation of a device isolation region 304 in a silicon substrate 302. In an example, the device isolation region 304 may be formed by doping the silicon substrate 302 with impurities. In this example, the device isolation region 304 may not be a shallow trench isolation (STI) region, and the device isolation region 304 may not be formed by filling a trench with an insulating material.

Figure 3B:
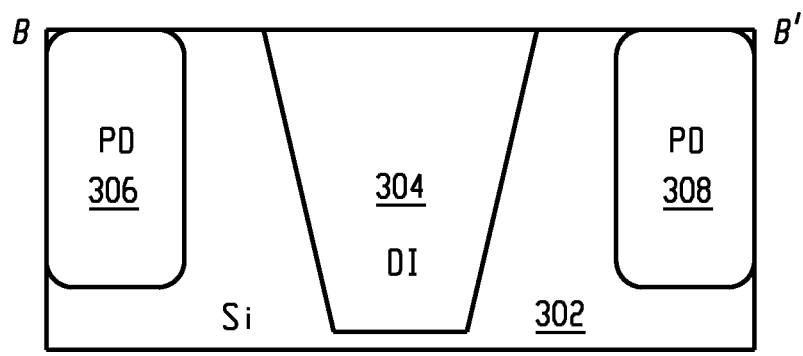

FIG. 3B may depict a formation of photosensitive regions 306, 308 in the silicon substrate 302. In FIG. 3B, the photosensitive regions 306, 308 may be defined during a portion of the fabrication process in which well regions are formed in the silicon substrate 302. In an example, in FIG. 3B, the photosensitive regions 306, 308 may be defined during a "well loop" portion of the fabrication process. Further processing to define the photosensitive regions 306, 308 may also occur during a different portion of the fabrication process. In an example, the further processing to form the photosensitive regions 306, 308 may occur during a "poly loop" portion of the fabrication process.

Figure 3C:
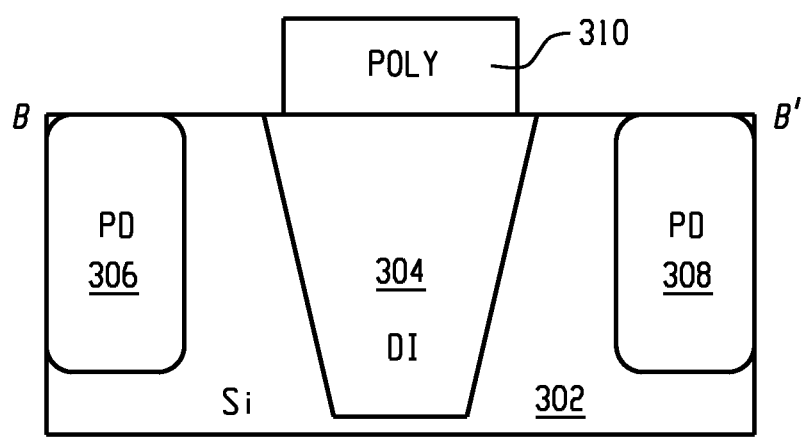

FIG. 3C may depict a formation of a polysilicon gate electrode 310 over the device isolation region 304. Although the example of FIG. 3C may depict the polysilicon gate electrode 310, in other examples, other materials may be used for the gate electrode 310. For example, the gate electrode 310 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), other conductive materials, or a combination thereof.

Figure 3D:
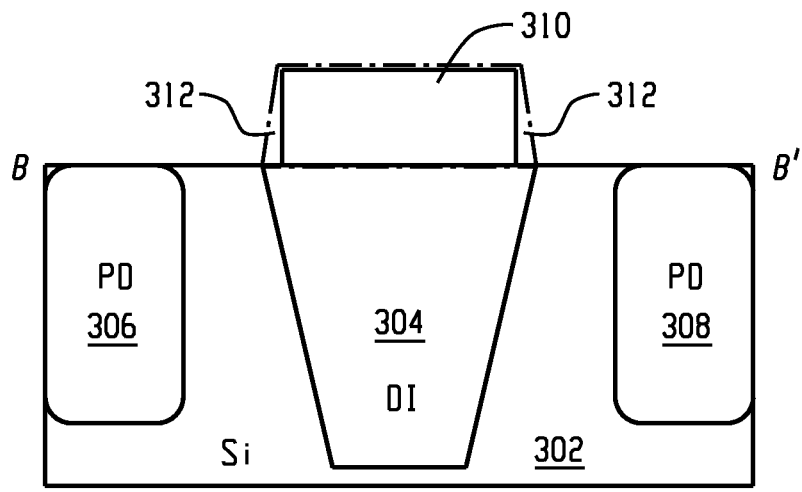

FIG. 3D may depict a formation of sidewall spacers 312 on sidewalls of the polysilicon gate electrode 310. The sidewall spacers 312 may be comprised of an oxide material (e.g., silicon oxide) or a nitride material (e.g., silicon nitride), for example, among other materials.

Figure 3E:
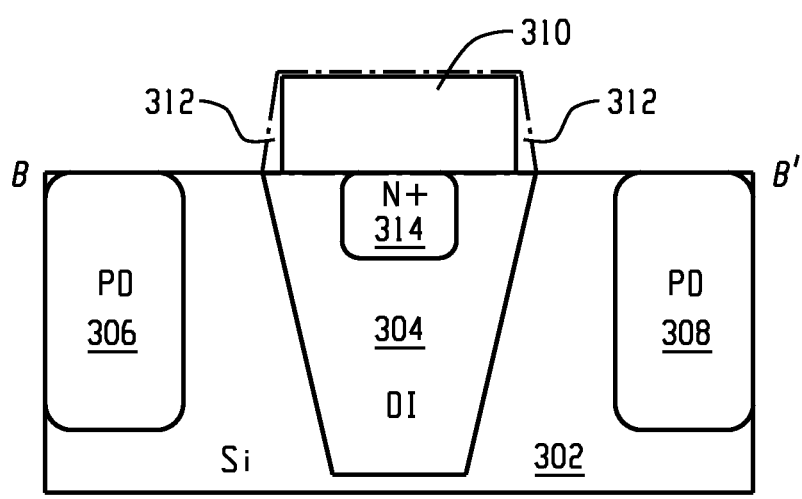

FIG. 3E may depict a formation of an N+ channel region 314 within the device isolation region 304. The N+ channel region 314 may be formed by doping a portion of the device isolation region 304 with additional n-type impurities. The doping of the portion of the device isolation region 304 to form the N+ channel region 314 may be achieved via an ion implantation process. The ion implantation process may also be used to define source and drain regions of a FET (not depicted in FIG. 3F), and the channel region 314 may be used to form a conductive channel between the source and drain regions.

Figure 4:
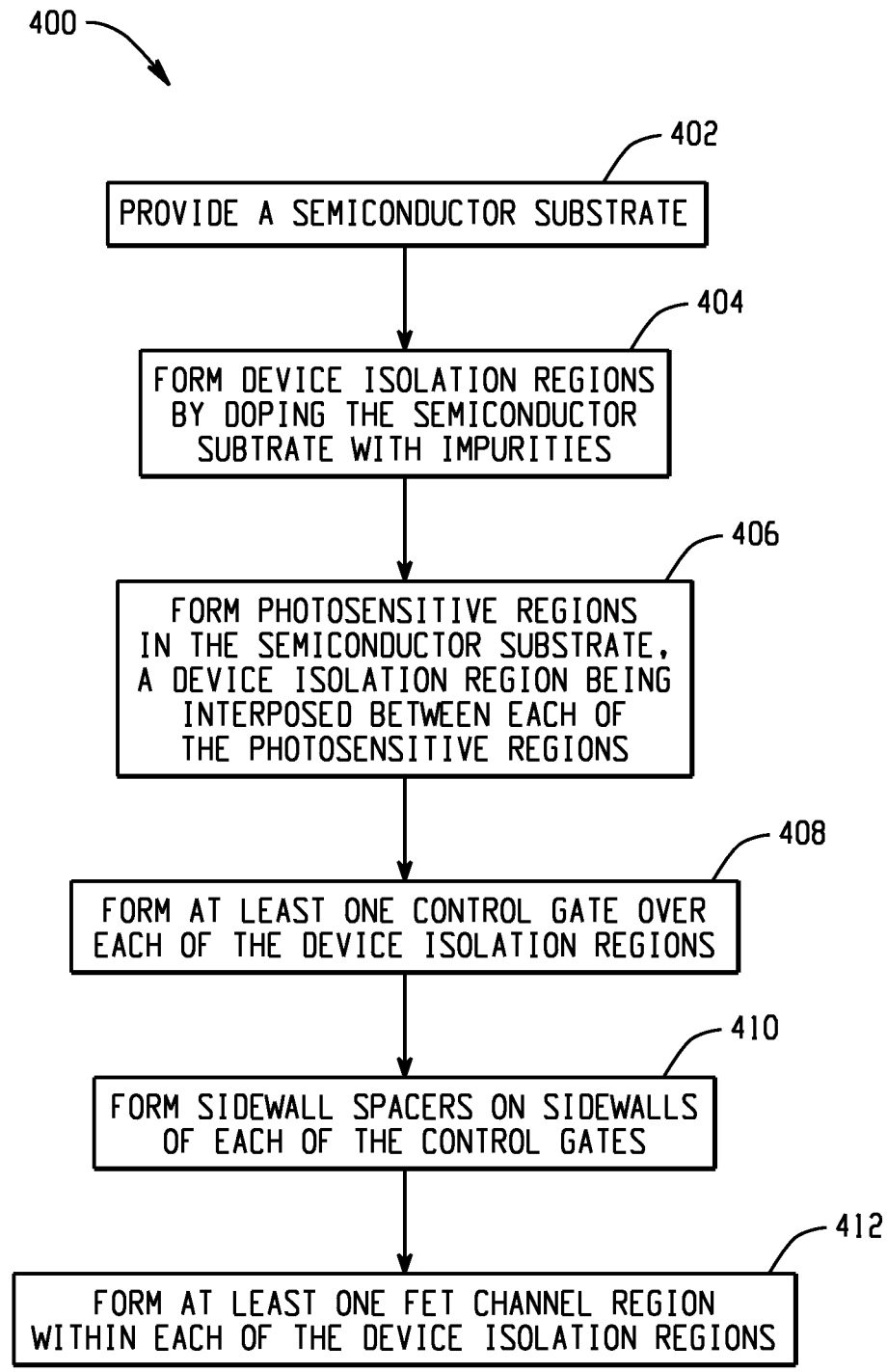
FIG. 4 is a flowchart illustrating an example method for fabricating a complementary metal oxide semiconductor (CMOS) image sensor.

FIG. 4 is a flowchart 400 illustrating an example method for fabricating a complementary metal oxide semiconductor (CMOS) image sensor. At 402, a semiconductor substrate may be provided. At 404, device isolation regions may be formed in the semiconductor substrate by doping the semiconductor substrate with impurities. At 406, photosensitive regions may be formed in the semiconductor substrate, where a device isolation region of the device isolation regions may be interposed between each of the photosensitive regions. The device isolation region may be configured to prevent crosstalk or interference between adjacent photosensitive regions. At 408, at least one control gate may be formed over each of the device isolation regions. At 410, sidewall spacers may be formed on sidewalls of each of the control gates. At 412, at least one field effect transistor (FET) channel region may be formed within each of the device isolation regions. The at least one FET channel region may be configured to connect source and drain regions of the FET.

The present disclosure is directed to a CMOS image sensor and a method for fabricating a CMOS image sensor. An example CMOS image sensor includes first active regions of a semiconductor substrate, where the first active regions are arranged in rows or columns. Photosensitive regions are formed in the first active regions. The CMOS image sensor also includes second active regions of the semiconductor substrate that are interposed between the first active regions. Each of the second active regions includes a device isolation region formed by doping the semiconductor substrate with impurities. The device isolation region is configured to prevent crosstalk or interference between adjacent photosensitive regions of the first active regions. Each of the second active regions also includes a channel region of a field effect transistor (FET) that is formed within the device isolation region and is configured to connect source and drain regions of the FET. At least one control gate is formed over each of the second active regions, where each of the control gates is configured to control a conductivity of an associated channel region.

In another example, an example CMOS image sensor includes photodiodes fabricated in a semiconductor substrate, where the photodiodes are arranged in rows or columns. The CMOS image sensor also includes active regions of the semiconductor substrate that are interposed between adjacent photodiodes of the photodiodes. Each of the active regions includes a device isolation region formed by doping the semiconductor substrate with impurities. The device isolation region is configured to prevent crosstalk or interference between the adjacent photodiodes. Each of the active regions further includes a channel region of a field effect transistor (FET) that is formed within the device isolation region. The channel region is disposed above a first portion of the device isolation region, and the channel region is formed by doping a second portion of the device isolation region with additional impurities. The CMOS image sensor further includes at least one control gate formed over each of the active regions.

In another example, in an example method for fabricating a CMOS image sensor, a semiconductor substrate is provided. Device isolation regions are formed in the semiconductor substrate by doping the semiconductor substrate with impurities. Photosensitive regions are formed in the semiconductor substrate, where a device isolation region of the device isolation regions is interposed between each of the photosensitive regions. The device isolation region is configured to prevent crosstalk or interference between adjacent photosensitive regions. At least one control gate is formed over each of the device isolation regions. Sidewall spacers are formed on sidewalls of each of the control gates. At least one field effect transistor (FET) channel region is formed within each of the device isolation regions. The at least one FET channel region is configured to connect source and drain regions of the FET.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A complementary metal oxide semiconductor (CMOS) image sensor, comprising:
   a substrate having a plurality of first and second active regions,
      the first active regions being arranged in rows with a predetermined gap there-between and defining a photosensitive region,
      the second active regions respectively interposing between an adjacent pair of the first active regions in the row, each of the second active regions including:
         a device isolation region comprising a first dopant type disposed in a single continuous volume and configured to prevent crosstalk and interference between the adjacent pair of the first active regions by providing electrical isolation between the adjacent pair of the first active regions, and
         a channel region of a second dopant type disposed in the device isolation region; and
      a control gate formed over each of the channel regions in the second active regions,
   wherein the channel region is surrounded by the device isolation region in cross-sectional view;
   wherein the device isolation region has a first vertical cross-sectional width at a portion coplanar with a top surface of the substrate and a second vertical cross-sectional width at a portion further from the top surface of the substrate, the second vertical cross-sectional width being smaller than the first vertical cross-sectional width; and
   wherein one or more of the photosensitive regions extends to an area that is nearly directly below the at least one control gate.

2. The CMOS image sensor of claim 1, wherein in each of the second active regions, the device isolation region includes a portion that extends beneath the channel region.

3. The CMOS image sensor of claim 1, wherein in each of the second active regions, the channel region is formed by doping a portion of the device isolation region with additional impurities.

4. The CMOS image sensor of claim 1, wherein in each of the second active regions, a lateral diffusion of the device isolation region does not affect a width of the channel region.

5. The CMOS image sensor of claim 4, wherein in each of the second active regions, the lateral diffusion of the device isolation region does not increase a narrow width effect in the CMOS image sensor.

6. The CMOS image sensor of claim 1, wherein in each of the second active regions, the device isolation region comprises a single, continuous volume of the semiconductor substrate that is disposed beneath the at least one control gate.

7. The CMOS image sensor of claim 6, wherein in each of the second active regions, the device isolation region does not include multiple, discrete volumes that surround the channel region.

8. The CMOS image sensor of claim 1, wherein in each of the second active regions, the device isolation region is disposed in a volume that is substantially directly below the at least one control gate, and wherein the volume does not extend a substantial distance laterally away from the at least one control gate.

9. The CMOS image sensor of claim 1, wherein the device isolation region is not a shallow trench isolation region, and wherein the device isolation region is not formed by filling a trench with an insulating layer.

10. The CMOS image sensor of claim 1, wherein each of the photosensitive regions comprises a photodiode.

11. The CMOS image sensor of claim 1, wherein the CMOS image sensor is substantially free of insulating layer between the first active regions and the device isolation region of the second active regions.

12. The CMOS image sensor of claim 11, wherein the CMOS image sensor is free of shallow trench isolation (STI) structure between the adjacent pair of the first active regions in the row.

13. The CMOS image sensor of claim 11, wherein the device isolation region spans substantially across the gap between the adjacent pair of the first active regions.

14. The CMOS image sensor of claim 1, wherein the device isolation region consumes a small amount of area relative to the area consumed by the photosensitive regions.

15. A complementary metal oxide semiconductor (CMOS) image sensor comprising:
 photodiodes fabricated in a semiconductor substrate, the photodiodes being arranged selectively in rows and columns;
 a plurality of active regions respectively interposed between adjacent photodiodes, wherein each of the active regions includes:
 a device isolation region comprising a first dopant type disposed in a single continuous volume and configured to prevent crosstalk and interference between the adjacent photodiodes by providing electrical isolation between the adjacent photodiodes, and
 a channel region of a second dopant type disposed in the device isolation region; and
 at least one control gate formed over each of the active regions,
 wherein the channel region is surrounded by the device isolation region in cross-sectional view;
 wherein the device isolation region has a first vertical cross-sectional width at a portion coplanar with a top surface of the substrate and a second vertical cross-sectional width at a portion further from the top surface of the substrate, the second vertical cross-sectional width being smaller than the first vertical cross-sectional width; and
 wherein one or more of the photodiodes extends to an area that is nearly directly below the at least one control gate.

16. A method of fabricating a complementary metal oxide semiconductor (CMOS) image sensor, the method comprising:
 providing a semiconductor substrate;
 forming device isolation regions in the semiconductor substrate by doping the semiconductor substrate with a first type dopant;
 forming photosensitive regions in the semiconductor substrate such that each of the device isolation regions is interposed respectively between each pair of adjacent photosensitive regions and the device isolation region is configured to prevent crosstalk and interference between the adjacent photosensitive regions by providing electrical isolation between the adjacent photosensitive regions;
 forming at least one control gate over each of the device isolation regions;
 forming sidewall spacers on sidewalls of each of the control gates; and
 forming a channel region of a second dopant type in each of the device isolation regions,
 wherein forming the channel region in the device isolation region comprises forming the channel region surrounded by the device isolation region in cross-sectional view;
 wherein the device isolation region has a first vertical cross-sectional width at a portion coplanar with a top surface of the substrate and a second vertical cross-sectional width at a portion further from the top surface of the substrate, the second vertical cross-sectional width being smaller than the first vertical cross-sectional width; and
 wherein one or more of the photosensitive regions extends to an area that is nearly directly below the at least one control gate.

17. The method of claim 16, wherein forming the device isolation regions comprises forming each of the device isolation regions including a portion that is beneath the at least one channel region.

18. The method of claim 16, wherein the at least one channel region is formed by doping a portion of a device isolation region with additional impurities.

19. The method of claim 16, wherein each of the device isolation regions is disposed in a volume that is substantially below the at least one control gate, and wherein the volume does not extend a substantial distance laterally away from the at least one control gate.

20. The method of claim 16, wherein the device isolation regions consume a small amount of area relative to the area consumed by the photosensitive regions.

* * * * *